US009941216B2

(12) United States Patent
Chiu et al.

(10) Patent No.: US 9,941,216 B2
(45) Date of Patent: Apr. 10, 2018

(54) CONDUCTIVE PATTERN AND INTEGRATED FAN-OUT PACKAGE HAVING THE SAME

(71) Applicant: Taiwan Semiconductor Manufacturing Co., Ltd., Hsinchu (TW)

(72) Inventors: Ming-Yen Chiu, Hsinchu County (TW); Ching-Fu Chang, Taipei (TW); Chien-Chia Chiu, Taoyuan (TW); Hsin-Chieh Huang, Hsin-Chu (TW); Tsung-Shu Lin, New Taipei (TW); Pei-Ti Yu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/281,043

(22) Filed: Sep. 29, 2016

(65) Prior Publication Data

US 2017/0345762 A1 Nov. 30, 2017

Related U.S. Application Data

(60) Provisional application No. 62/343,013, filed on May 30, 2016.

(51) Int. Cl.
*H01L 23/538* (2006.01)
*H01L 25/10* (2006.01)

(52) U.S. Cl.
CPC ...... *H01L 23/5386* (2013.01); *H01L 23/5383* (2013.01); *H01L 23/5384* (2013.01); *H01L 23/5389* (2013.01); *H01L 25/105* (2013.01); *H01L 2225/1035* (2013.01); *H01L 2225/1041* (2013.01); *H01L 2225/1058* (2013.01)

(58) Field of Classification Search
CPC . H01L 25/18; H01L 23/5385; H01L 23/5384; H01L 21/4853; H01L 23/49816; H01L 23/49811; H01L 23/5389; H01L 25/105; H01L 24/19; H01L 25/50; H01L 24/83; H01L 24/16; H01L 24/32; H01L 24/92; H01L 23/3114; H01L 24/73
See application file for complete search history.

(56) References Cited

U.S. PATENT DOCUMENTS

| 8,049,113 B2 * | 11/2011 | He .................... H05K 1/025 174/255 |
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |

(Continued)

*Primary Examiner* — Jarrett Stark
(74) *Attorney, Agent, or Firm* — JCIPRNET

(57) ABSTRACT

A conductive pattern including a teardrop shaped portion, a routing line, and a connection portion is provided. The routing line links to the teardrop shaped portion through the connection portion, and a width of the connection portion decreases along an extending direction from the teardrop shaped portion to the routing line. Furthermore, an integrated fan-out package including the above-mentioned conductive pattern is also provided.

17 Claims, 16 Drawing Sheets

(56) References Cited

U.S. PATENT DOCUMENTS

| | | |
|---|---|---|
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2012/0319295 A1* | 12/2012 | Chi ..................... H01L 21/561 257/774 |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

\* cited by examiner

CONDUCTIVE PATTERN AND INTEGRATED FAN-OUT PACKAGE HAVING THE SAME

CROSS-REFERENCE TO RELATED APPLICATION

This application claims the priority benefits of U.S. provisional application Ser. No. 62/343,013, filed on May 30, 2016. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the reliability of the redistribution circuit structure fabricated on the molding compound is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
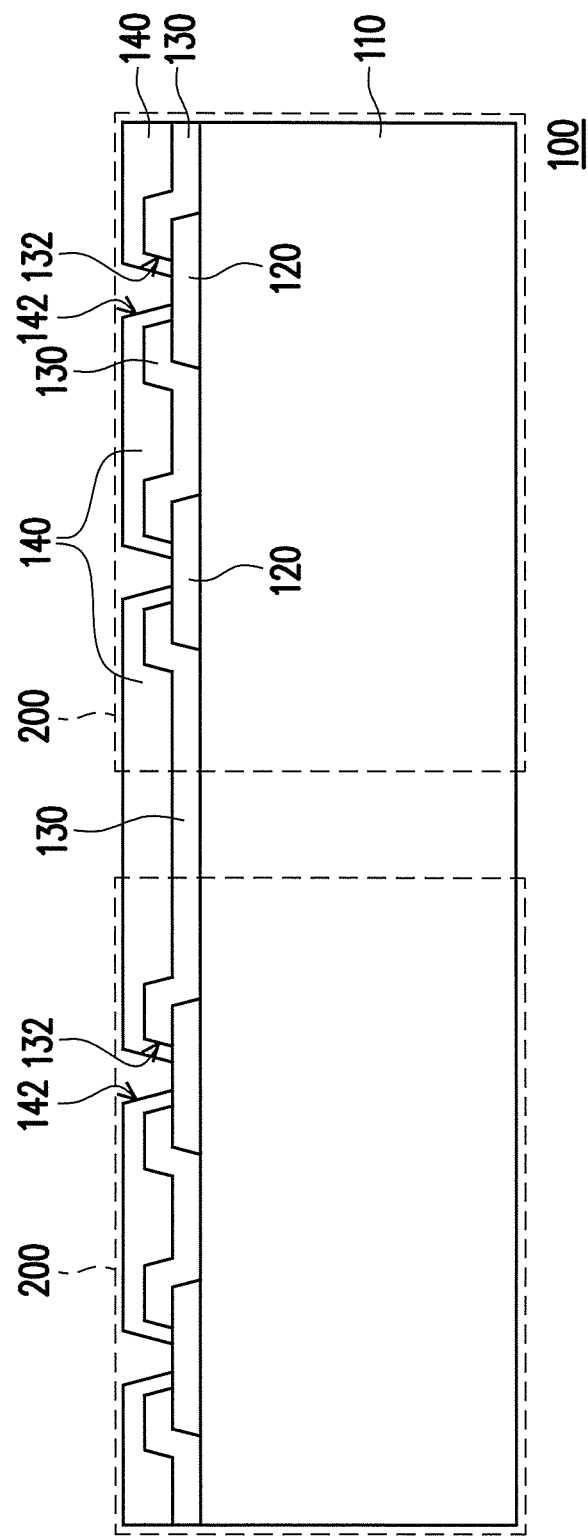
FIGS. 1 through 13 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 13:
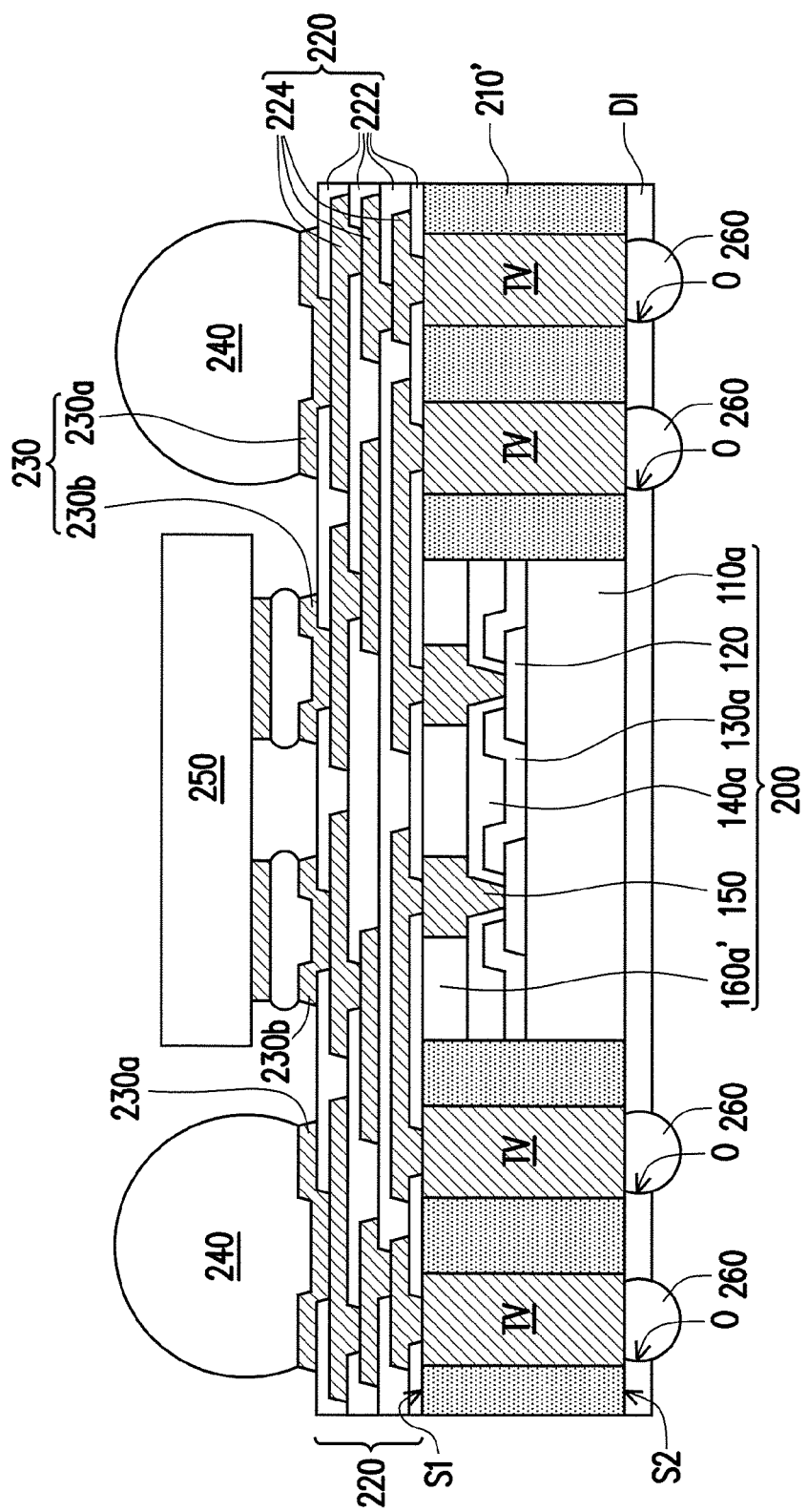
Figure 14:
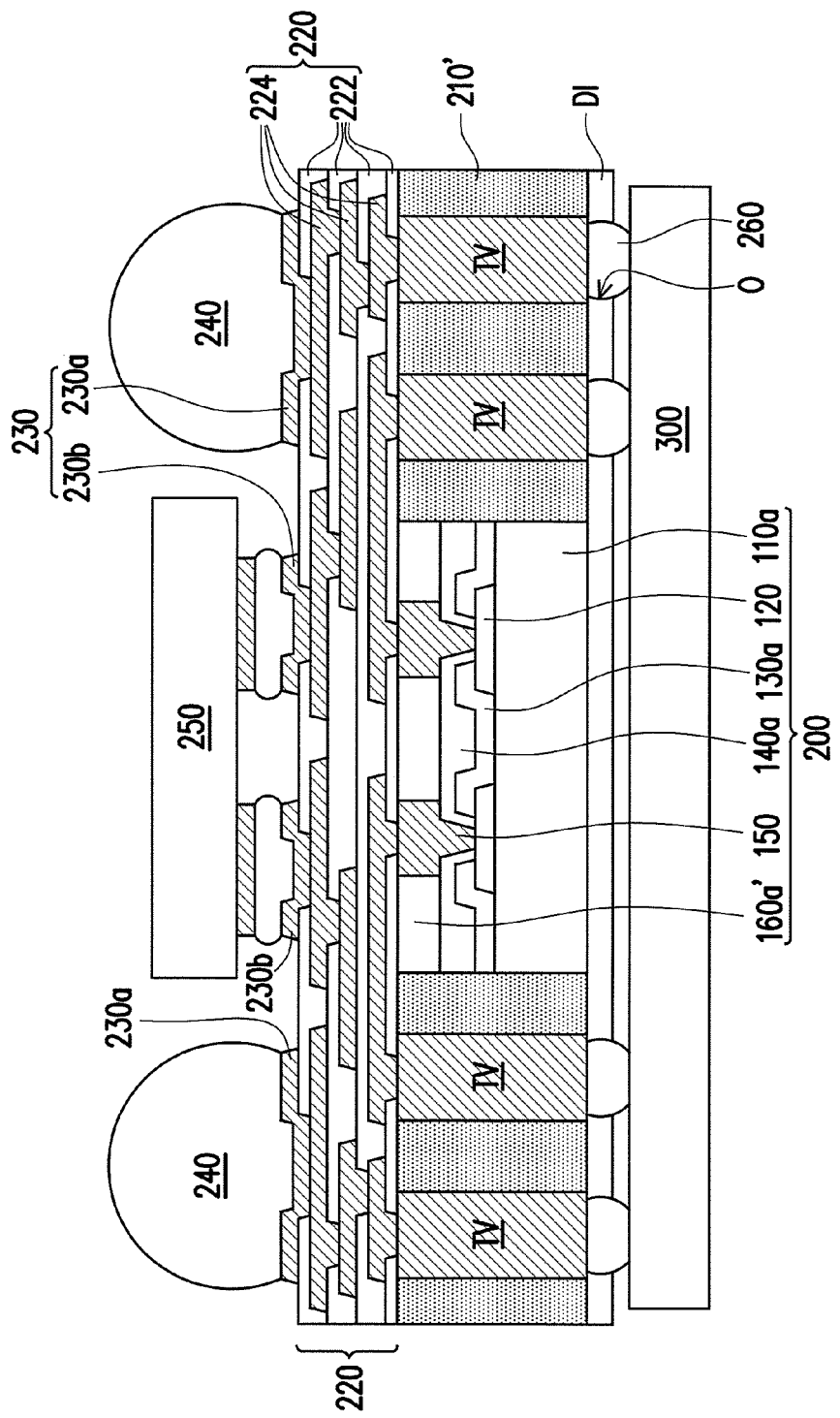
FIG. 14 is a cross-sectional view illustrating a package-on-package (POP) structure in accordance with some embodiments.

FIGS. 1 through 13 illustrate a process flow for fabricating an integrated fan-out package in accordance with some embodiments, and FIG. 14 is a cross-sectional view illustrating a package-on-package (POP) structure in accordance with some embodiments.

Referring to FIG. 1, a wafer 100 including a plurality of dies or integrated circuits 200 arranged in an array is provided. Before a wafer dicing process is performed on the wafer 100, the integrated circuits 200 of the wafer 100 are connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may optionally include a post-passivation layer 140 formed over the passivation layer 130. The post-passivation layer 140 covers the passivation layer 130 and has a plurality of contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 2:
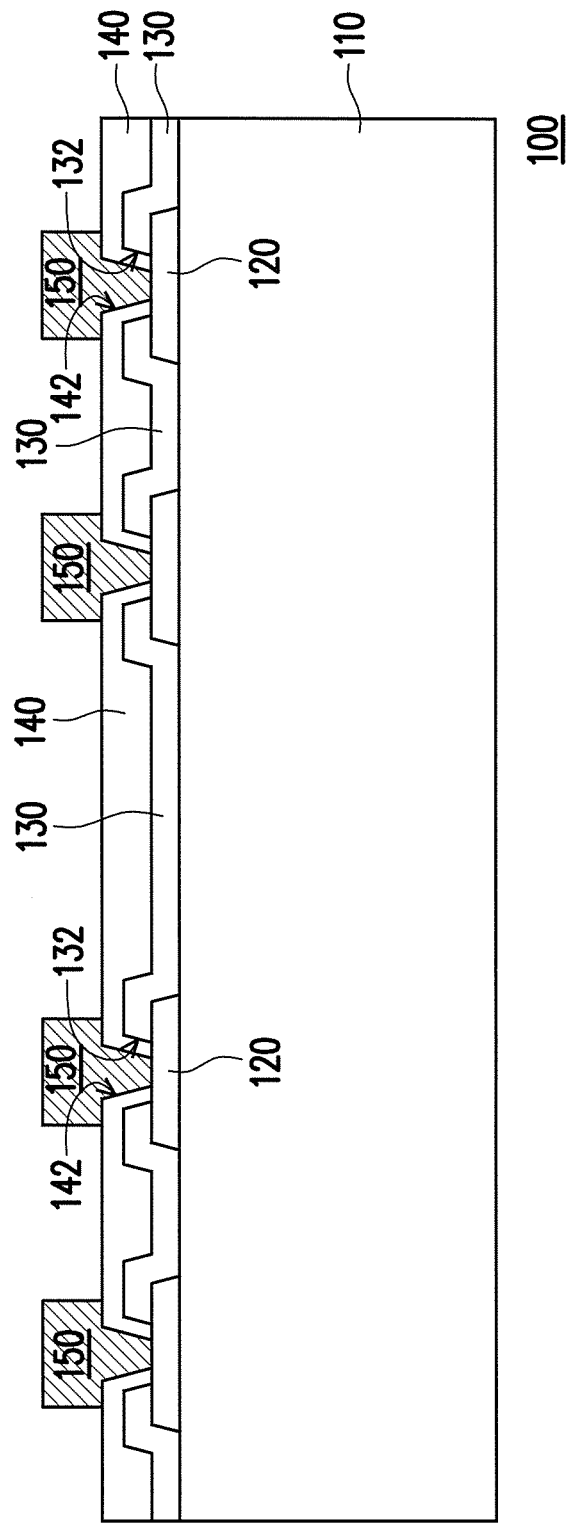

Referring to FIG. 2, a plurality of conductive pillars 150 are formed on the conductive pads 120. In some embodiments, the conductive pillars 150 are plated on the conductive pads 120. The plating process of conductive pillars 150 is described in detail as followings. First, a seed layer is sputtered onto the post-passivation layer 140 and the conductive pads 120 exposed by the contact openings 142. A patterned photoresist layer (not shown) is then formed over the seed layer by photolithography, wherein the patterned photoresist layer exposes portions of the seed layer that are corresponding to the conductive pads 120. The wafer 100 including the patterned photoresist layer formed thereon is then immersed into a plating solution of a plating bath such that the conductive pillars 150 are plated on the portions of the seed layer that are corresponding to the conductive pads 120. After the plated conductive pillars 150 are formed, the patterned photoresist layer is stripped. Thereafter, by using the conductive pillars 150 as a hard mask, portions of the seed layer that are not covered by the conductive pillars 150 are removed through etching until the post passivation layer 140 is exposed, for example.

In some embodiments, the conductive pillars 150 are plated copper pillars or plated copper pillars.

Figure 3:
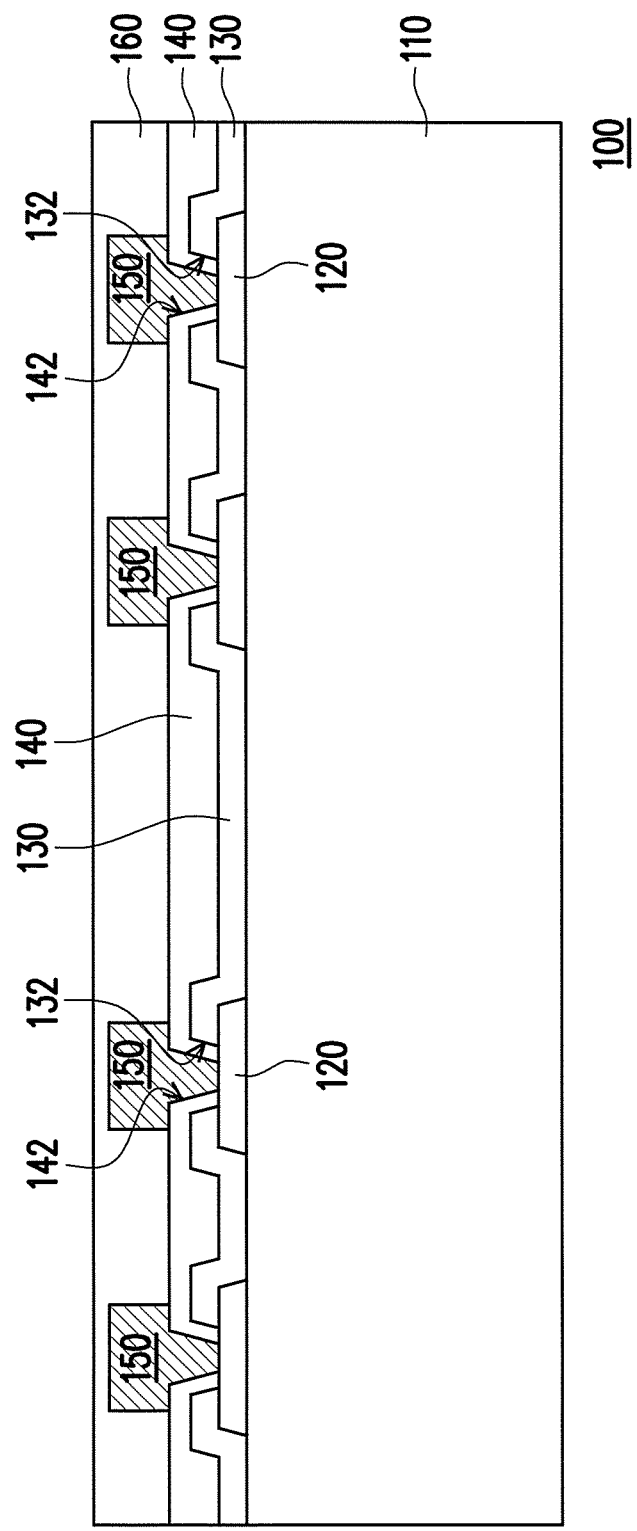

Referring to FIG. 3, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PB 0) layer, a polyimide (PI) layer or other suitable polymers. In some alternative embodiments, the protection layer 160 may be made of inorganic materials.

Figure 4:
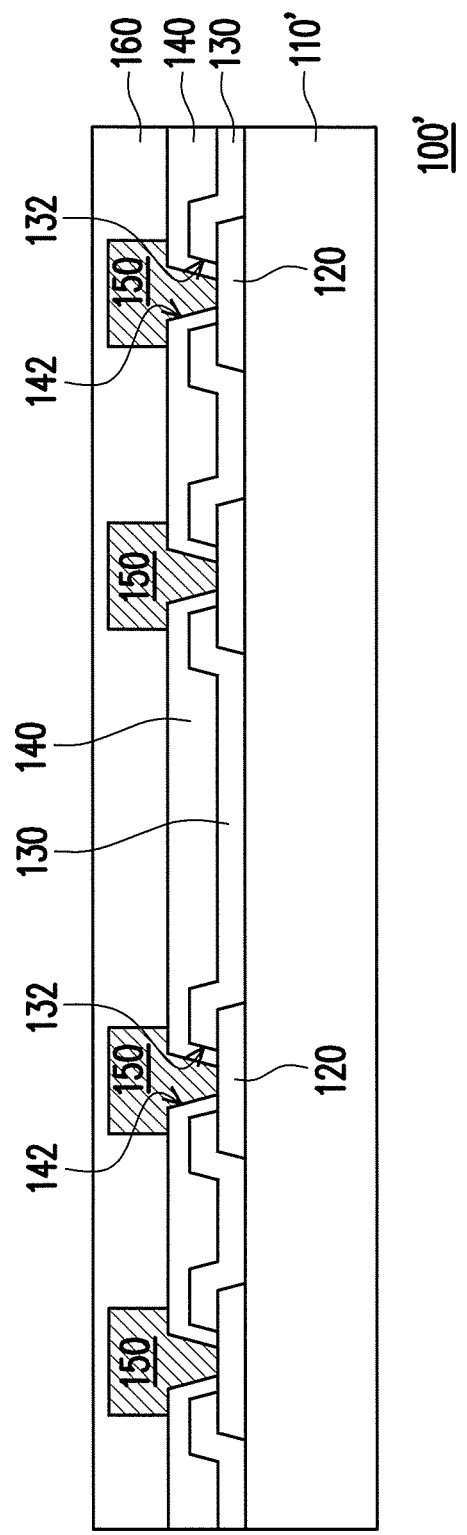

Referring to FIG. 4, a back side grinding process is performed on the rear surface of the wafer 100 after the protection layer 160 is formed. During the back side grinding process, the semiconductor substrate 110 is grinded such that a thinned wafer 100' including a thinned semiconductor substrate 110' is formed.

Figure 5:
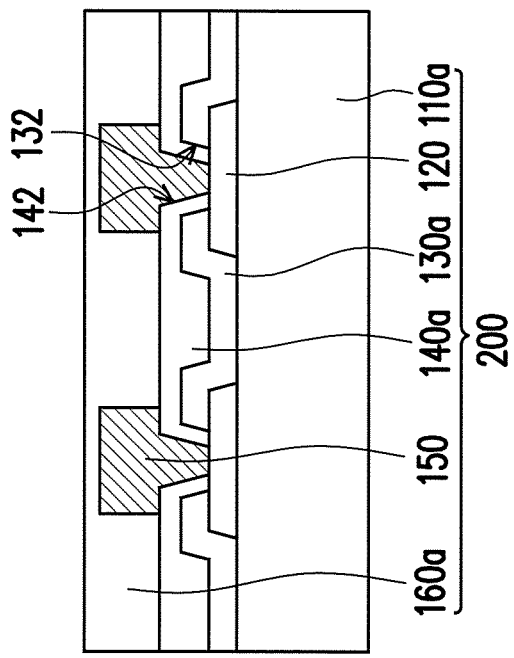
Figure 5:
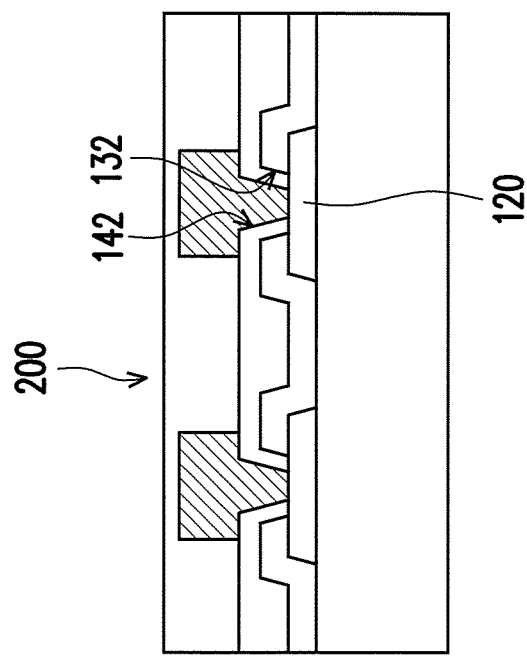

Referring to FIG. 5, after the back side grinding process is performed, a wafer dicing process is performed on the thinned wafer 100' such that the integrated circuits 200 in the wafer 100' are singulated from one another. Each of the singulated integrated circuits 200 includes a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4 and FIG. 5, during the back side grinding and the wafer dicing processes, the protection layer 160 and 160a may well protect the conductive pillars 150 of the integrated circuits 200. In addition, the conductive pillars 150 of the integrated circuits 200 may be protected from being damaged by sequentially performed processes, such as the pick-up and placing process of the integrated circuits 200, the molding process, and so on.

Figure 6:
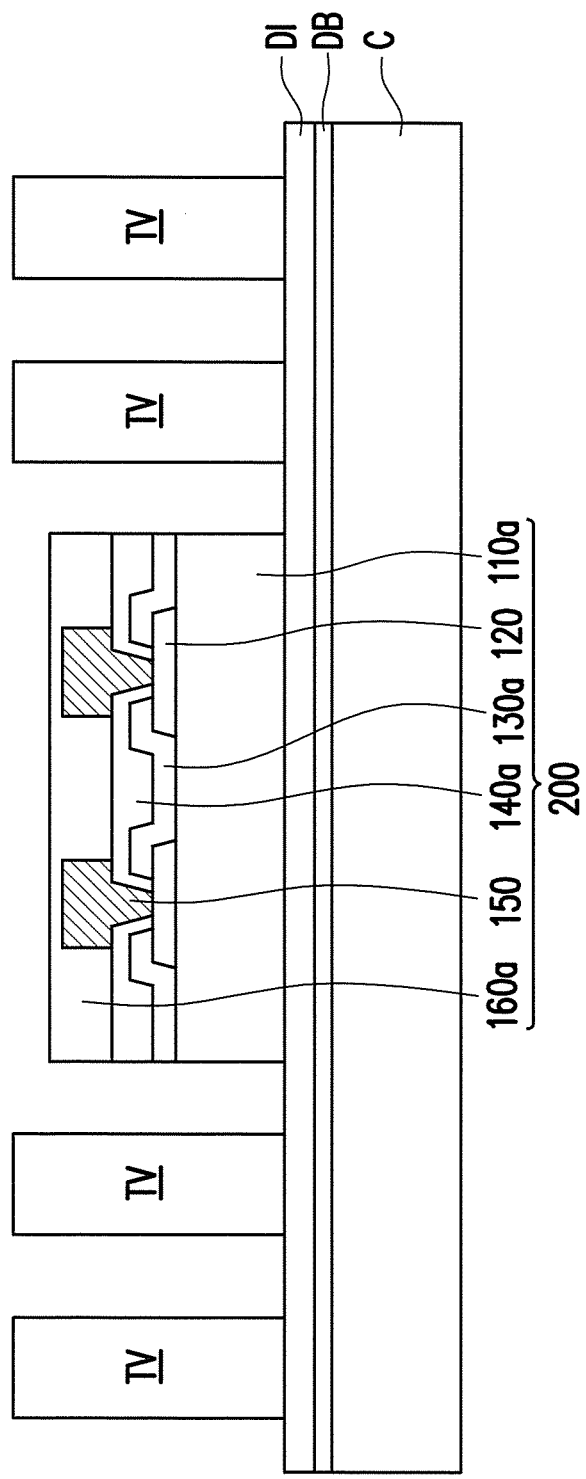

Referring to FIG. 6, after the integrated circuits 200 are singulated from the thinned wafer 100' (shown in FIG. 4), a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

After the carrier C having the de-bonding layer DB and the dielectric layer DI formed thereon is provided, a plurality of conductive through vias TV are formed on the dielectric layer DI. In some embodiments, the plurality of conductive through vias TV is formed by photoresist coating, photolithography, plating, and photoresist stripping process. For example, the conductive through vias TV include copper posts or other suitable metal post.

As shown in FIG. 6, in some embodiments, one of the integrated circuits 200 including the conductive pads 120, the conductive pillars 150, and a protection layer 160a formed thereon is picked and placed on the dielectric layer DI. The integrated circuits 200 is attached or adhered on the dielectric layer DI through a die attach film (DAF), an adhesion paste or the like. In some alternative embodiments, more than one of the integrated circuits 200 are picked and placed on the dielectric layer DI, wherein the integrated circuits 200 placed on the dielectric layer DI may be arranged in an array. When the integrated circuits 200 placed on the dielectric layer DI are arranged in an array, the conductive through vias TV may be classified into groups. The number of the integrated circuits 200 is corresponding to the number of the groups of the conductive through vias TV.

As shown in FIG. 6, the top surface of the protection layer 160a is lower than the top surfaces of the conductive through vias TV, and the top surface of the protection layer 160a is higher than the top surfaces of the conductive pillars 150, for example. However, the disclosure is not limited thereto. In some alternative embodiments, the top surface of the protection layer 160a may be substantially aligned with the top surfaces of the conductive through vias TV, and the top surface of the protection layer 160a is higher than the top surfaces of the conductive pillars 150.

As shown in FIG. 6, the integrated circuit 200 is picked and placed on the dielectric layer DI after the formation of the conductive through vias TV. However, the disclosure is not limited thereto. In some alternative embodiments, the integrated circuit 200 is picked and placed on the dielectric layer DI before the formation of the conductive through vias TV.

Figure 7:
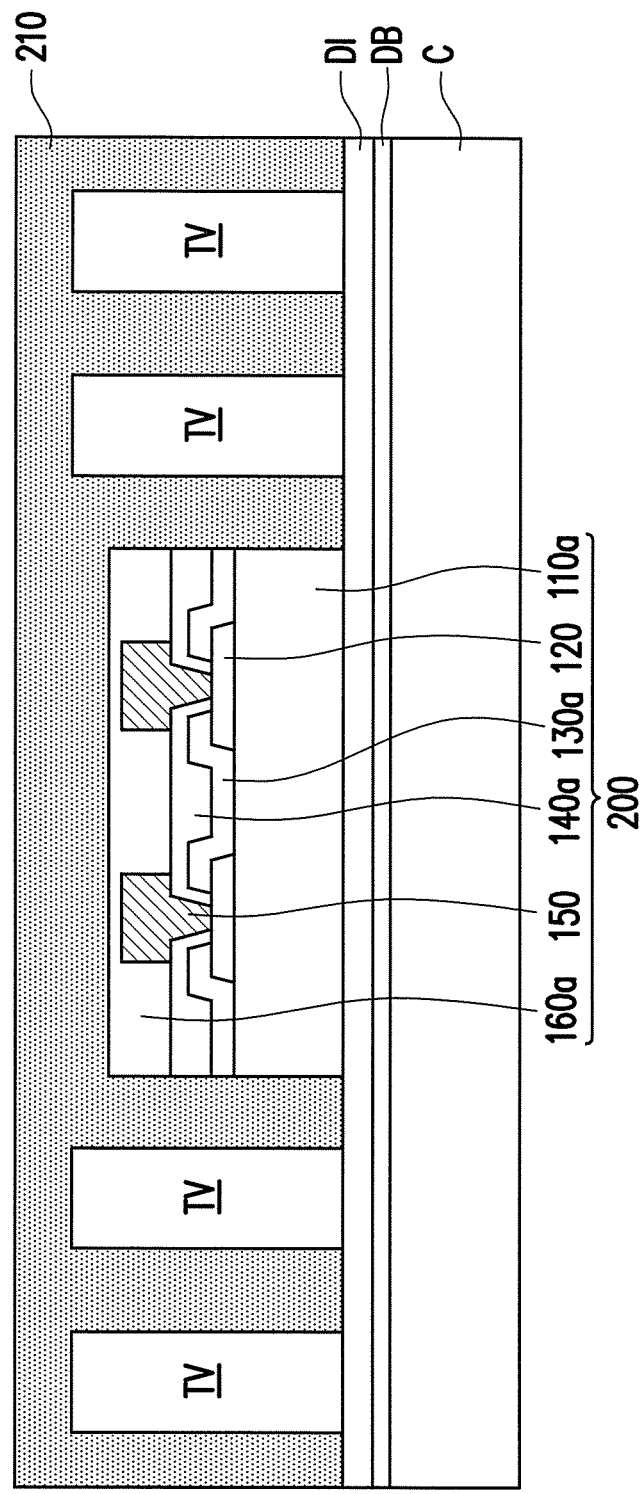

Referring to FIG. 7, an insulating material 210 is formed on the dielectric layer DI to cover the integrated circuit 200 and the conductive through vias TV. In some embodiments, the insulating material 210 is a molding compound formed by a molding process. The conductive pillars 150 and the protection layer 160a of the integrated circuit 200 are covered by the insulating material 210. In other words, the conductive pillars 150 and the protection layer 160a of the integrated circuit 200 are not revealed and are well protected by the insulating material 210. In some embodiments, the insulating material 210 includes epoxy or other suitable dielectric materials.

Figure 8:
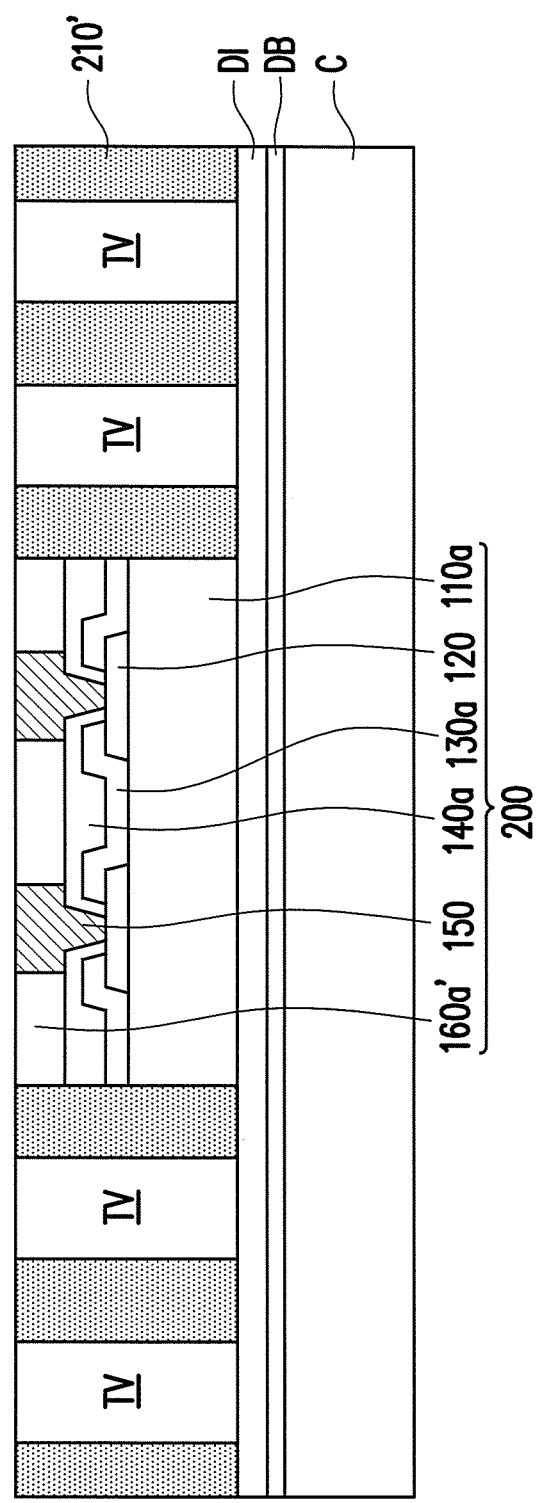

Referring to FIG. 8, the insulating material 210 is then grinded until the top surfaces of the conductive pillars or conductive pillars 150, the top surfaces of the conductive through vias TV, and the top surface of the protection layer 160a are exposed. In some embodiments, the insulating material 210 is grinded by a mechanical grinding process and/or a chemical mechanical polishing (CMP) process. After the insulating material 210 is grinded, an insulating encapsulation 210' is formed over the dielectric layer DI. During the grinding process of the insulating material 210, portions of the protection layer 160a are grinded to form a protection layer 160a'. In some embodiments, during the grinding process of the insulating material 210 and the protection layer 160a, portions of the conductive through vias TV and portions of the conductive pillars 150 are grinded also.

As shown in FIG. 8, the insulating encapsulation 210' encapsulates the sidewalls of the integrated circuit 200, and the insulating encapsulation 210' is penetrated by the conductive through vias TV. In other words, the integrated circuit 200 and the conductive through vias TV are embedded in the insulating encapsulation 210'. It is noted that the top surfaces of the conductive through vias TV, the top surface of the insulating encapsulation 210', and the top surfaces of the conductive pillars 150 are substantially coplanar with the top surface of the protection layer 160a'.

Figure 9:
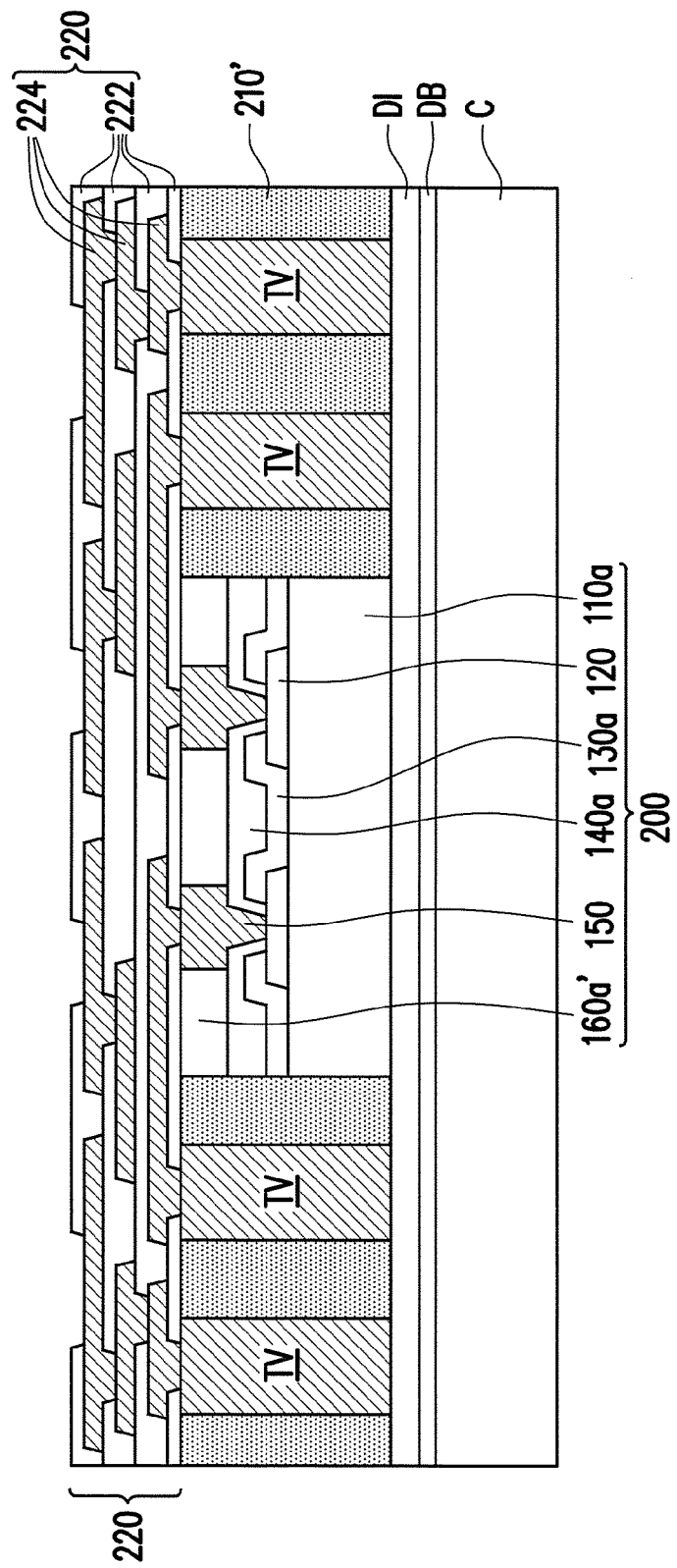

Referring to FIG. 9, after the insulating encapsulation 210' and the protection layer 160a' are formed, a redistribution circuit structure 220 electrically connected to the conductive pillars 150 of the integrated circuit 200 is formed on the top surfaces of the conductive through vias TV, the top surface of the insulating encapsulation 210', the top surfaces of the conductive pillars 150, and the top surface of the protection layer 160a'. The redistribution circuit structure 220 is fabricated to electrically connect with one or more connectors underneath. Here, the afore-said connectors may be the conductive pillars 150 of the integrated circuit 200 and/or the conductive through vias TV embedded in the insulating encapsulation 210'. The redistribution circuit structure 220 is described in accompany with FIG. 9 in detail.

Referring to FIG. 9, the redistribution circuit structure 220 includes a plurality of inter-dielectric layers 222 and a plurality of redistribution conductive layers 224 stacked alternately, and the redistribution conductive layers 224 are electrically connected to the conductive pillars 150 of the integrated circuit 200 and the conductive through vias TV embedded in the insulating encapsulation 210'. In some embodiments, the top surfaces of the conductive pillars 150 and the top surfaces of the conductive through vias TV are in contact with the redistribution circuit structure 220. The top surfaces of the conductive pillars 150 and the top surfaces of the conductive through vias TV are partially covered by the bottommost inter-dielectric layer 222. Furthermore, the topmost redistribution conductive layer 224 includes a plurality of conductive patterns P.

Figure 10:
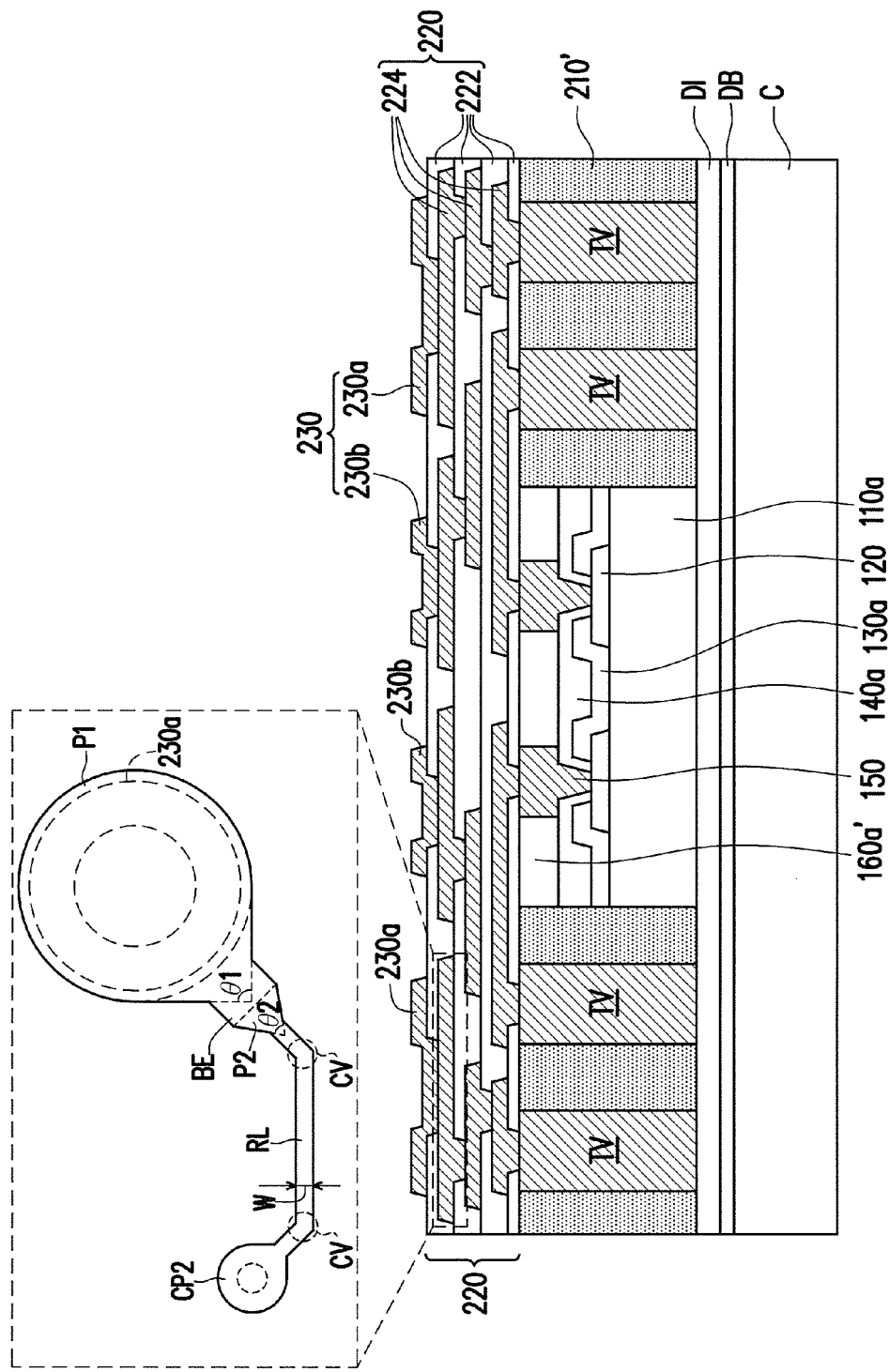

As shown in FIG. 10, after the redistribution circuit structure 220 is formed, a plurality of pads 230 are then formed on the topmost redistribution conductive layer 224 of the redistribution circuit structure 220. The pads 230 include a plurality of under-ball metallurgy (UBM) patterns 230a for ball mount and a plurality of connection pads 230b for mounting of passive components. The pads 230 are electrically connected to the topmost redistribution conductive layer 224 of the redistribution circuit structure 220. In other words, the pads 230 are electrically connected to the conductive pillars 150 of the integrated circuit 200 and the conductive through vias TV through the redistribution circuit structure 220. It is noted that the number of the UBM patterns 230a and the connection pads 230b is not limited in this disclosure.

Figure 10A:
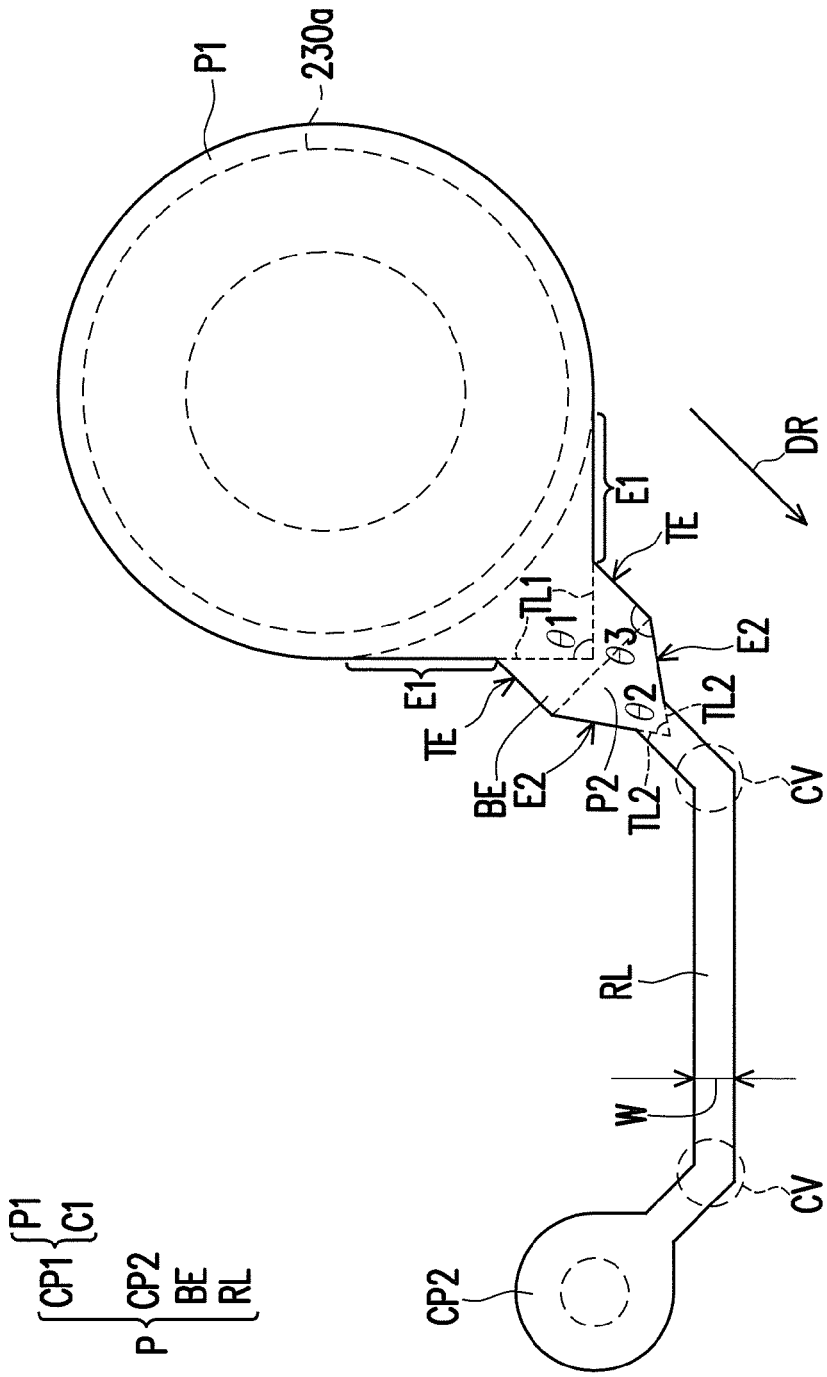
FIG. 10A is a top view illustrating the conductive pattern P in accordance with some embodiments.
Figure 10B:
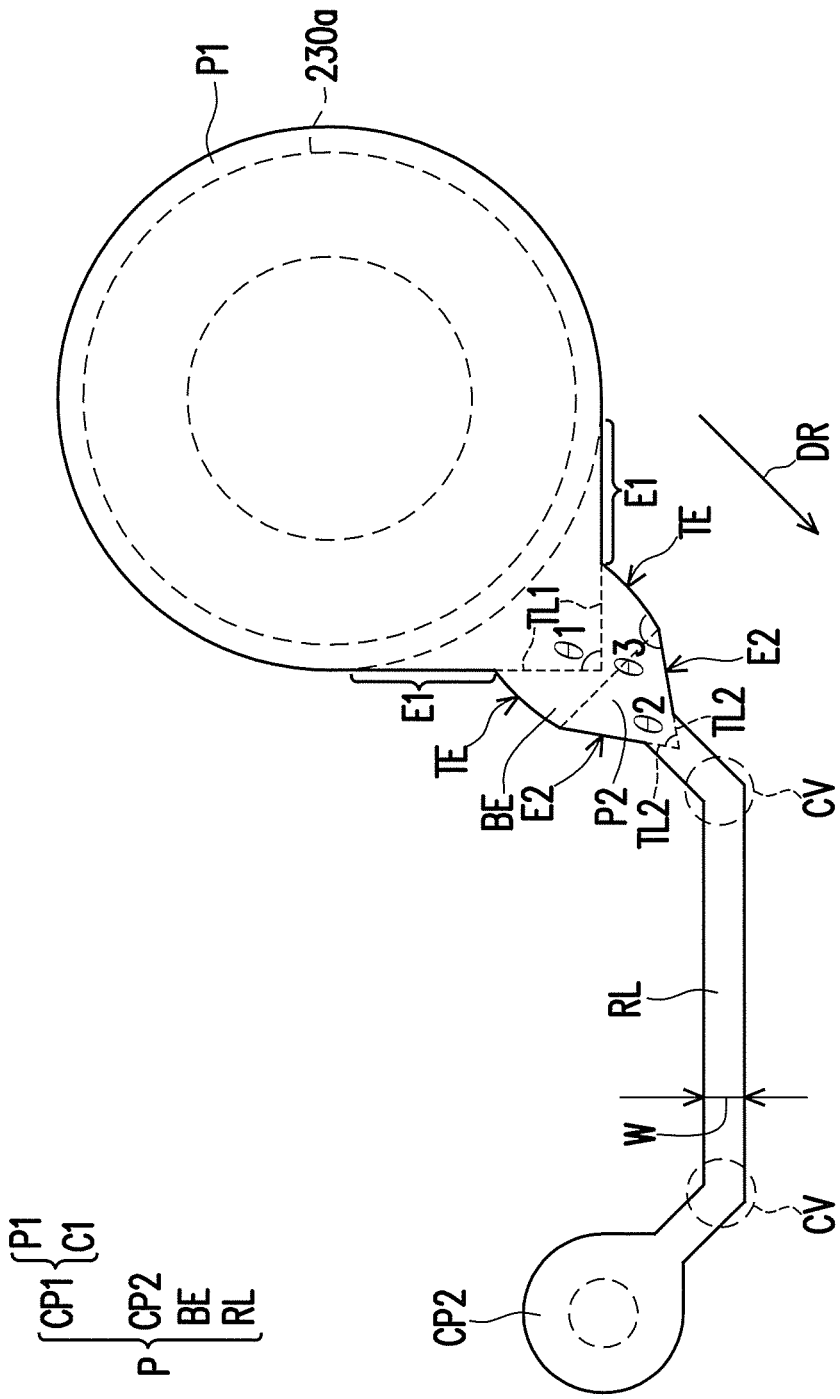
FIG. 10B is a top view illustrating the conductive pattern P in accordance with some alternative embodiments.

Referring to FIG. 10, FIG. 10A and FIG. 10B, in some embodiment, the conductive patterns P are disposed under and electrically connected to the UBM patterns 230a. Each of the conductive patterns P may include a first conductive pad CP1 and a buffer extension BE linked to the first conductive pad CP1. The first conductive pad CP1 includes a rounding pad portion P1 and a first converging portion C1 linked to the rounding pad portion P1. The first converging portion C1 has a pair of nonparallel first edges E1 that define a first taper angle θ1, and the pair of nonparallel first edges E1 are defined by a pair of nonparallel first tangent lines TL1 of the rounding pad portion P1. The buffer extension BE is linked to the first converging portion C1 of the first conductive pad CP1. The buffer extension BE at least includes a second converging portion P2 having a pair of nonparallel second edges E2 that define a second taper angle θ2. As shown in FIG. 10A and FIG. 10B, the rounding pad portion P1 is located under and electrically connected to the UBM patterns 230a, for example.

In some embodiments, the first taper angle θ1 is greater than the second taper angle θ2, and the difference between the first taper angle θ1 and the second taper angle θ2 is about 10 degree to about 30 degree. In some alternative embodiments, the first taper angle θ1 is substantially equal to the included angle θ2.

The buffer extension BE may further include a pair of transition edges TE between the pair of nonparallel first edges E1 and the pair nonparallel of second edges E2. As shown in FIG. 10A, the transition edges TE are substantially linear edges and the linear edges parallel to each other. When the transition edges TE are substantially linear edges, the buffer extension BE extends along the extending direction DR, and the maximum width of the buffer extension BE is substantially equal to the minimum distance between the pair of nonparallel first edges E1 or the maximum distance of the pair of nonparallel second edges E2. Furthermore, the included angle θ3 defined by the transition edges TE and the second edges E2 of the buffer extension BE may range from about 120 degree to about 175 degree, for example.

In some alternative embodiments, as shown in FIG. 10B, the transition edges TE may be curved edges. When the transition edges TE are curved edges, the buffer extension BE extends along the extending direction DR, and the minimum width of the buffer extension BE is substantially equal to the minimum distance between the pair of nonparallel first edges E1 or the maximum distance of the pair of nonparallel second edges E2.

In some yet embodiments, the transition edges TE of the buffer extension BE may be omitted.

In some embodiments, the conductive pattern P may further include a routing line RL linked to the first conductive pad CP1 through the buffer extension BE. As shown in FIG. 10A and FIG. 10B, the routing line RL is linked to the second converging portion P2 of the buffer extension BE. The buffer extension BE is between the routing line RL and the first conductive pad CP1, and the routing line RL has a substantially constant line width. The buffer extension BE may serve as a transition structure between the first conductive pad CP1 and the routing line RL so as to minimize stress.

In some embodiments, the ratio of the minimum distance between the pair of nonparallel first edges E1 to the minimum distance of the pair of nonparallel second edges E2 (i.e. the line width W of the routing line RL) may range from about 1.1 to about 4.

In some embodiments, the routing line RL has a substantially constant line width W, and the routing line RL has at least one curved portion CV. The line width W of the routing line RL may range from about 1 micrometer to about 25 micrometers. As shown in FIG. 10A, two curved portions CV of the routing line RL are shown for illustration. However, the disclosure is not limited thereto. In some embodiments, the distance between the curved portion CP (the right one) and the link point of the buffer extension BE and the routing line RL may range from about 10 micrometers to about 20 micrometers.

As shown in FIG. 10A and FIG. 10B, in some embodiments, the conductive pattern P may further include a second conductive pad CP2. The second conductive pad CP2 is linked to the first conductive pad CP1 through the routing line RL and the buffer extension BE. The second conductive pad CP2 is electrically connected to one of the redistribution conductive layers 224 underneath. In some embodiments, the area of the first conductive pad CP1 is larger than the area of the second conductive pad CP2. In some alternative embodiments, the area of the first conductive pad CP1 is substantially equal to the area of the second conductive pad CP2.

Figure 11:
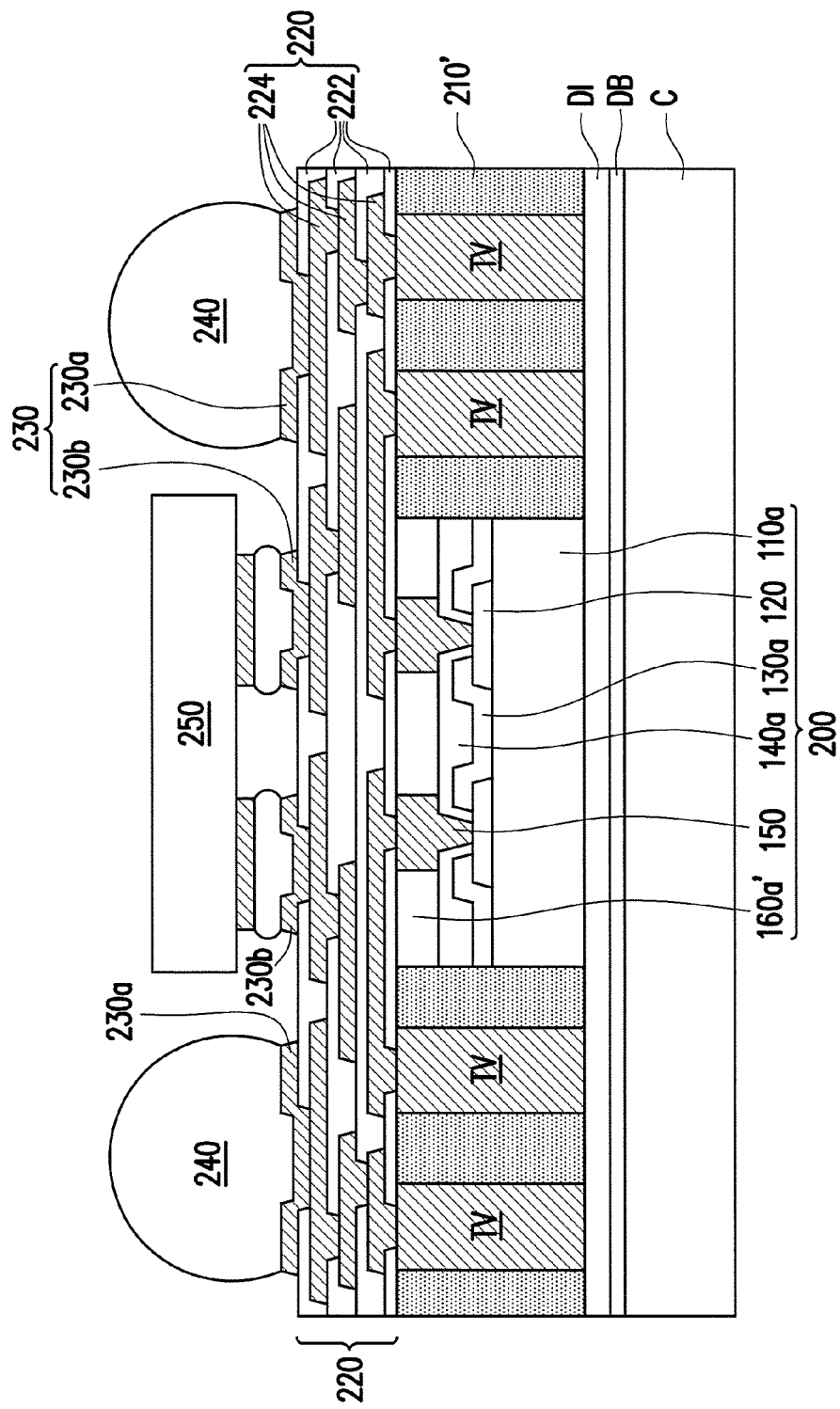

Referring to FIG. 11, after the UBM patterns 230a and the connection pads 230b are formed, a plurality of conductive balls 240 are placed on the under-ball metallurgy patterns 230a, and a plurality of passive components 250 are mounted on the connection pads 230b. In some embodiments, the conductive balls 240 may be placed on the under-ball metallurgy patterns 230a by a ball placement process, and the passive components 250 may be mounted on the connection pads 230b through a solder or reflow process. In some embodiments, the height of the conductive balls 240 is greater than the height of the passive components 250, for example.

Figure 12:
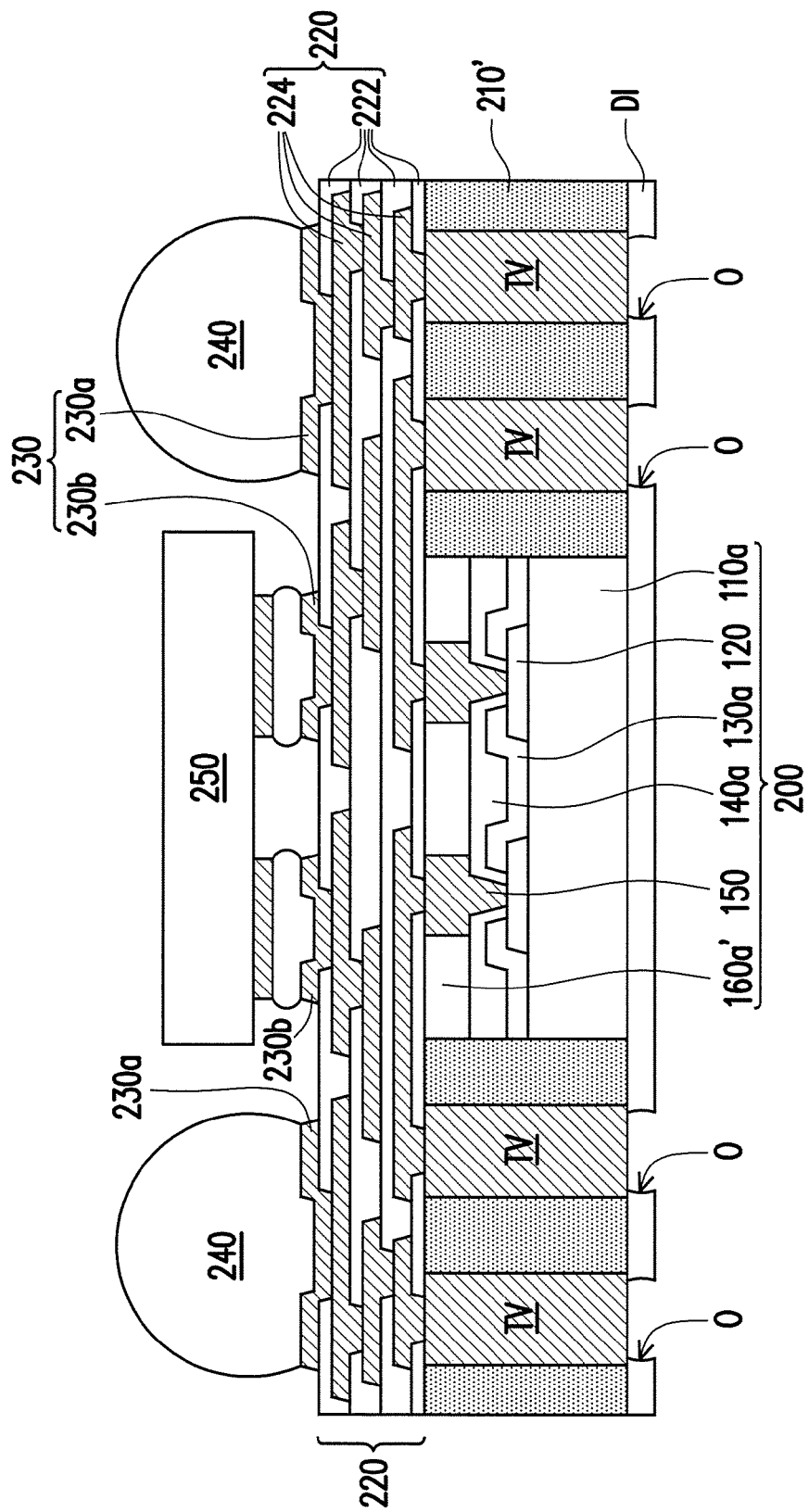

Referring to FIG. 11 and FIG. 12, after the conductive balls 240 and the passive components 250 are mounted on the pads 230, the dielectric layer DI formed on the bottom surface of the insulating encapsulation 210' is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C.

As shown in FIG. 12, the dielectric layer DI is then patterned such that a plurality of contact openings O are formed to expose the bottom surfaces of the conductive through vias TV. The number and position of the contact openings O are corresponding to the number of the conductive through vias TV. In some embodiments, the contact openings O of the dielectric layer DI are formed by a laser drilling process or other suitable patterning processes.

Referring to FIG. 13, after the contact openings O are formed in the dielectric layer DI, a plurality of conductive balls 260 are placed on the bottom surfaces of the conductive through vias TV that are exposed by the contact openings O. And, the conductive balls 250 are, for example, reflowed to bond with the bottom surfaces of the conductive through vias TV. As shown in FIG. 13, after the conductive balls 230 and the conductive balls 250 are formed, an integrated fan-out package of the integrated circuit 200 having dual-side terminal design (i.e. the conductive balls 240 and 260) is accomplished.

Referring to FIG. 14, another package 300 is then provided. In some embodiments, the package 300 is, for example, a memory device or other suitable semiconductor devices. The package 300 is stacked over and is electrically connected to the integrated fan-out package illustrated in FIG. 12 through the conductive balls 260 such that a package-on-package (POP) structure is fabricated.

In the above-mentioned embodiments, the connection portion P4 may serve as a transition portion to minimize stress between the first conductive pad P1 and the routing line P3. Accordingly, the reliability of the conductive pattern P is enhanced.

In accordance with some embodiments of the present disclosure, a conductive pattern including a teardrop shaped portion, a routing line, and a connection portion is provided. The routing line links to the teardrop shaped portion through the connection portion, and a width of the connection portion decreases along an extending direction from the teardrop shaped portion to the routing line.

In accordance with alternative embodiments of the present disclosure, another conductive pattern including a first conductive pad, a routing line, a connection portion, and a second conductive pad is provided. The routing line links to the first conductive pad through the connection portion, and a width of the connection portion decreases along an extending direction from the first conductive pad to the routing line. The second conductive pad is linked to the routing line, and the routing line is between the first conductive pad and the second conductive pad.

In accordance with yet alternative embodiments of the present disclosure, an integrated fan-out package including an integrated circuit, an insulating encapsulation, and a redistribution circuit structure is provided. The insulating encapsulation encapsulates the integrated circuit. The redistribution circuit structure is disposed on the insulating encapsulation and the integrated circuit. The redistribution circuit structure includes a plurality of inter-dielectric layers and a plurality of redistribution conductive layers, and the inter-dielectric layers and the redistribution conductive layers are stacked alternately. The topmost redistribution conductive layer includes at least one conductive pattern, and the at least one conductive pattern includes a first conductive pad, a routing line, a connection portion, and a second conductive pad. The routing line links to the first conductive pad through the connection portion, and a width of the connection portion decreases along an extending direction from the first conductive pad to the routing line. The second conductive pad is linked to the routing line, and the routing line is between the first conductive pad and the second conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A conductive pattern, comprising:
   a conductive pad comprising a rounding pad portion and a first converging portion linked to the rounding pad portion, the first converging portion having a pair of nonparallel first edges that define a first taper angle, and the pair of nonparallel first edges being defined by a pair of nonparallel first tangent lines of the rounding pad portion; and
   a buffer extension linked to the first converging portion of the conductive pad, the buffer extension comprising a second converging portion having a pair of nonparallel second edges and a pair of transition edges between the pair of nonparallel first edges and the pair nonparallel of second edges, wherein the pair of nonparallel second edges define a second taper angle, and the first taper angle is greater than or substantially equal to the second taper angle, and wherein the transition edges are curved edges, and the curved edges are convex edges of the buffer extension.

2. The conductive pattern of claim 1 further comprising a routing line linked to the second converging portion, wherein the buffer extension is between the routing line and the conductive pad, and the routing line has a substantially constant line width.

3. The conductive pattern of claim 2, wherein the routing line has at least one curved portion.

4. The conductive pattern of claim 1, wherein the buffer extension extends along an extending direction, a minimum width of the buffer extension is substantially equal to a minimum distance between the pair of nonparallel first edges or a maximum distance of the pair of nonparallel second edges.

5. A conductive pattern, comprising:
a first conductive pad comprising a rounding pad portion and a first converging portion linked to the rounding pad portion, the first converging portion having a pair of nonparallel first edges that define a first taper angle, and the pair of nonparallel first edges being defined by a pair of nonparallel first tangent lines of the rounding pad portion;
a buffer extension linked to the first converging portion of the first conductive pad, the buffer extension at least comprising a second converging portion having a pair of nonparallel second edges that define a second taper angle, the first taper angle being greater than or substantially equal to the second taper angle;
a routing line linked to the first conductive pad through the buffer extension, the routing line being linked to the second converging portion; and
a second conductive pad linked to the first conductive pad through the routing line and the buffer extension,
wherein a minimum distance between the first conductive pad and the second conductive pad is less than a length of a path from the first conductive pad and the second conductive pad along with the buffer extension and the routing line.

6. The conductive pattern of claim 5, wherein the routing line has a substantial constant line width.

7. The conductive pattern of claim 5, wherein the routing line has at least one curved portion.

8. The conductive pattern of claim 5, wherein an area of the first conductive pad is larger than or substantially equal to an area of the second conductive pad.

9. The conductive pattern of claim 5, wherein the buffer extension further comprises a pair of transition edges between the pair of nonparallel first edges and the pair nonparallel of second edges.

10. The conductive pattern of claim 9, wherein the transition edges are linear edges and the linear edges parallel to each other.

11. The conductive pattern of claim 10, wherein the buffer extension extends along an extending direction, a maximum width of the buffer extension is substantially equal to a minimum distance between the pair of nonparallel first edges or a maximum distance of the pair of nonparallel second edges.

12. The conductive pattern of claim 9, wherein the transition edges are curved edges.

13. The conductive pattern of claim 12, wherein the buffer extension extends along an extending direction, a minimum width of the buffer extension is substantially equal to a minimum distance between the pair of nonparallel first edges or a maximum distance of the pair of nonparallel second edges.

14. An integrated fan-out package, comprising:
an integrated circuit;
an insulating encapsulation encapsulating the integrated circuit;
a redistribution circuit structure on the insulating encapsulation and the integrated circuit, the redistribution circuit structure comprising a plurality of inter-dielectric layers and a plurality of redistribution conductive layers, the inter-dielectric layers and the redistribution conductive layers being stacked alternately, wherein the topmost redistribution conductive layer comprises at least one conductive pattern, and the at least one conductive pattern comprises:
a conductive pad comprising a rounding pad portion and a first converging portion linked to the rounding pad portion, the first converging portion having a pair of nonparallel first edges that define a first taper angle, and the pair of nonparallel first edges being defined by a pair of nonparallel first tangent lines of the rounding pad portion; and
a buffer extension linked to the first converging portion of the conductive pad, the buffer extension comprising a second converging portion having a pair of nonparallel second edges and a pair of transition edges between the pair of nonparallel first edges and the pair nonparallel of second edges, wherein the pair of nonparallel second edges define a second taper angle, and the first taper angle is greater than or substantially equal to the second taper angle, and wherein the transition edges are curved edges, and the curved edges are convex edges of the buffer extension.

15. The integrated fan-out package of claim 14, wherein the at least one conductive pattern further comprises a routing line linked to the second converging portion, wherein the buffer extension is between the routing line and the conductive pad, and the routing line has a substantially constant line width.

16. The integrated fan-out package of claim 15, wherein the routing line has at least one curved portion.

17. The integrated fan-out package of claim 15, wherein the buffer extension extends along an extending direction, a minimum width of the buffer extension is substantially equal to a minimum distance between the pair of nonparallel first edges or a maximum distance of the pair of nonparallel second edges.

* * * * *